United States Patent
Shin et al.

(10) Patent No.: US 7,714,394 B2
(45) Date of Patent: May 11, 2010

(54) CMOS SEMICONDUCTOR DEVICES HAVING ELEVATED SOURCE AND DRAIN REGIONS AND METHODS OF FABRICATING THE SAME

(75) Inventors: Dong-Suk Shin, Yongin-si (KR); Hwa-Sung Rhee, Seongnam-si (KR); Tetsuji Ueno, Suwon-si (KR); Ho Lee, Cheonan-si (KR); Seung-Hwan Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/285,978

(22) Filed: Nov. 23, 2005

(65) Prior Publication Data

US 2006/0131656 A1    Jun. 22, 2006

(30) Foreign Application Priority Data

Dec. 17, 2004    (KR) ...................... 10-2004-0108060

(51) Int. Cl.
    *H01L 23/58* (2006.01)
(52) U.S. Cl. ................................ 257/375; 257/E21.634
(58) Field of Classification Search .................. 257/377, 257/E21.634, 375
    See application file for complete search history.

(56) References Cited

U.S. PATENT DOCUMENTS

| | | | |
|---|---|---|---|
| 5,913,115 A | 6/1999 | Bieb et al. | |
| 6,429,084 B1 | 8/2002 | Park et al. | |
| 6,673,705 B2 * | 1/2004 | Miyashita | 438/585 |
| 2002/0008261 A1 * | 1/2002 | Nishiyama | 257/288 |
| 2002/0034864 A1 | 3/2002 | Mizushima et al. | |
| 2002/0074612 A1 * | 6/2002 | Bulucea et al. | 257/402 |

(Continued)

FOREIGN PATENT DOCUMENTS

JP    07-321217    12/1995

(Continued)

OTHER PUBLICATIONS

English Abstract Publication No. 10-1997-0053066.

*Primary Examiner*—Bradley K Smith
*Assistant Examiner*—Amar Movva
(74) *Attorney, Agent, or Firm*—F. Chau & Associates, LLC

(57) ABSTRACT

A Complementary Metal Oxide Semiconductor (CMOS) device is provided. The CMOS device includes an isolation layer provided in a semiconductor substrate to define first and second active regions. First and second gate patterns are disposed to cross over the first and second active regions, respectively. A first elevated source region and a first elevated drain region are disposed at both sides of the first gate pattern respectively, and a second elevated source region and a second elevated drain region are disposed at both sides of the second gate pattern respectively. The first elevated source/drain regions are provided on the first active region, and the second elevated source/drain regions are provided on the second active region. A first gate spacer is provided between the first gate pattern and the first elevated source/drain regions. A second gate spacer is provided to cover edges of the second elevated source/drain regions adjacent to the second gate pattern and an upper sidewall of the second gate pattern. Methods of fabricating the CMOS device is also provided.

23 Claims, 7 Drawing Sheets

U.S. PATENT DOCUMENTS

2004/0188769 A1 * 9/2004 Tsuno .................. 257/371

FOREIGN PATENT DOCUMENTS

| JP | 2004-266278 | 9/2004 |
| KR | 1997-0053066 | 7/1997 |
| KR | 1020010004981 | 1/2001 |
| KR | 1020030007804 | 1/2003 |
| KR | 2003-0073867 | 9/2003 |

* cited by examiner

CMOS SEMICONDUCTOR DEVICES HAVING ELEVATED SOURCE AND DRAIN REGIONS AND METHODS OF FABRICATING THE SAME

CROSS-REFERENCE TO RELATED APPLICATION

This application claims the benefit of Korean Patent Application No. 10-2004-0108060, filed on Dec. 17, 2004 in the Korean Intellectual Property Office, the disclosure of which is incorporated by reference herein in its entirety.

BACKGROUND OF THE INVENTION

1. Field of the Invention

The present invention relates to semiconductor devices and method of fabricating the same and, more particularly, to Complementary Metal Oxide semiconductor (CMOS) devices having elevated source/drain regions and methods of fabricating the same.

2. Description of the Related Art

Metal Oxide Semiconductor (MOS) transistors are widely employed as discrete devices of semiconductor devices. As semiconductor devices have become more highly integrated, MOS transistors have been scaled down. In particular, the channel length of MOS transistors have been reduced to implement a high performance semiconductor device. However, when the channel length of an MOS transistor is reduced, the MOS transistor typically suffers from a short channel effect. Accordingly, to improve the short channel effect, the junction depth of source/drain regions of the MOS transistors also needs to be reduced. That is, to fabricate high performance MOS transistors, there is a need for a method of forming shallow source/drain regions. Nevertheless, even shallow source/drain regions may lead to increase of on-resistance of the MOS transistors. The increase of the on-resistance may in turn lead to degradation of the current drivability of the MOS transistor.

Accordingly, an elevated source/drain structure has been designed to suppress the above-mentioned short channel effect and improve the current drivability. This elevated source/drain structure has been designed by a widely known technique called selective epitaxial growth.

The above selective epitaxial growth technique is disclosed in U.S. Pat. No. 6,429,084 B1 to Park et al., entitled "MOS Transistors with Raised Sources and Drains". Park et al. purports to disclose forming a gate capping insulating layer on a gate electrode. The gate capping insulating layer prevents an epitaxial semiconductor layer on source/drain regions from being formed on the gate electrode during formation of the epitaxial semiconductor layer. However, in the event that a metal silicide layer is formed on the gate electrode in a subsequent process, an additional complicated process may be required to form its MOS transistor with raised source and drain regions.

In addition, a method of forming the elevated source/drain regions is disclosed in U.S. Patent Publication No. US 2002/0034864 A1 to Mizushima et al., entitled "Semiconductor Device and Method of Fabricating the Same". Mizushima et al. purports to disclose using a blanket deposition technique to form an amorphous silicon layer on an entire surface of a semiconductor substrate having a polysilicon gate electrode and single crystalline source/drain regions. The amorphous silicon layer is crystallized using a solid phase epitaxial (SPE) technique. As a result, only the amorphous silicon layer on the single crystalline source/drain regions is crystallized to form elevated single crystalline source/drain regions. Moreover, the amorphous silicon layer on the polysilicon gate electrode may be converted into a polycrystalline silicon layer or kept the same in an amorphous state.

Further, according to conventional methods such as those described in Mizushima, the amorphous silicon layer (or the polycrystalline silicon layer) on the gate electrode is selectively removed using a hydrogen chloride (HCl) gas. The single crystalline silicon layer on the source/drain regions is then crystallized using a single step solid phase epitaxial process. Mizushima also describes that the single crystalline silicon layer is formed evenly on an isolation layer adjacent to the source/drain regions. However, a difficulty with the above process described in Mizushima, is that when the width of the isolation layer is reduced in order to fabricate a highly integrated semiconductor device, an electrical shortage may occur between the source/drain regions formed at both sides of the isolation layer.

Conventional elevated source/drain regions, such as those described above, may be employed in both N-Channel Metal Oxide Semiconductor (NMOS) transistors and Positive Channel Metal Oxide Semiconductor (PMOS) transistors. Moreover, MOS transistors having the elevated source/drain regions include insulating gate spacers provided on sidewalls of the gate electrode to form Lightly Doped Drain (LDD) type source/drain regions, with a salicide (self-aligned silicide) technique applied thereto. The gate spacers electrically insulate the gate electrode from the elevated source/drain regions.

However, in conventional semiconductor devices, when the width of the gate spacers increases, coupling capacitance between the gate electrode and the elevated source/drain regions decreases, and electrical resistance of the LDD type source/drain regions increases. As a result, the operating speed of the NMOS transistors is typically improved, whereas an operating speed of the PMOS transistors is typically degraded, because a mobility of electrons acting as carriers of the NMOS transistors is larger than a mobility of holes acting as carriers of the PMOS transistors. In other words, in conventional semiconductor devices, the operating speed of the NMOS transistors depends on parasitic capacitance between the gate electrode and the source/drain regions rather than the electrical resistance of the source/drain regions, and the operating speed of the PMOS transistors depends on electrical resistance of the source/drain regions rather than the parasitic capacitance between the gate electrode and the source/drain regions. Therefore, there is a need for optimizing the operating characteristics of both the NMOS transistors and the PMOS transistors that employ the elevated source/drain regions.

SUMMARY OF THE INVENTION

In an exemplary embodiment of the present invention, a Complementary Metal Oxide Semiconductor (CMOS) device is provided. The CMOS device includes an isolation layer provided in a semiconductor substrate to define first and second active regions. First and second gate patterns are disposed to cross over the first and second active regions, respectively. A first elevated source region and a first elevated drain region are provided at both sides of the first gate pattern, respectively. The first elevated source/drain regions are located on the first active region. A first gate spacer is provided between the first gate pattern and the first elevated source/drain regions. A second elevated source region and a second elevated drain region are provided at both sides of the second gate pattern, respectively. The second elevated source/drain regions are located on the second active region. A second gate spacer is provided to cover edges of the second elevated source/drain regions and an upper sidewall of the second gate pattern.

In another exemplary embodiment of the present invention, a method of fabricating a Complementary Metal Oxide Semiconductor (CMOS) device is provided The method includes forming an isolation layer in a predetermined region of a semiconductor substrate to define first and second active regions and forming first and second gate patterns that cross over the first and second active regions respectively. A first dummy gate spacer and a second dummy gate spacer are formed on sidewalls of the first and second gate patterns respectively, and the second dummy gate spacer is etched. First elevated source/drain regions and second elevated source/drain regions are formed on the first and second active regions of the substrate where the second dummy gate spacer is etched. The first dummy gate spacer is etched to form an opening. A first outer gate spacer is formed in the opening. The first outer gate spacer is formed to cover a sidewall of the first gate pattern. A second outer gate spacer is formed on edges of the second elevated source/drain regions adjacent to the second gate pattern during formation of the first outer gate spacer.

In still another exemplary embodiment of the present invention, a method of fabricating a Metal Oxide Semiconductor (MOS) transistor is provided. The method comprises forming an isolation layer in a predetermined region of a semiconductor substrate to define an active region and forming a gate pattern that crosses over the active region. An inner gate spacer is formed on a sidewall of the gate pattern. A dummy gate spacer is formed on an outer sidewall of the inner gate spacer. Elevated source/drain regions are formed on the active region adjacent to the dummy gate spacer. The dummy gate spacer is removed to form an opening. First impurity ions are implanted into the active region using the gate pattern, the inner gate spacer and the elevated source/drain regions as ion implantation masks, thereby forming low-concentration source/drain regions in the active region under the opening which is located at both sides of the gate pattern. An outer gate spacer is formed to cover an outer sidewall of the inner gate spacer and to fill the opening. Second impurity ions are implanted into the active region using the gate pattern, the inner gate spacer and the outer gate spacer as ion implantation masks, thereby forming high-concentration source/drain regions and doping the elevated source/drain regions with the second impurity ions.

DETAILED DESCRIPTION OF EXEMPLARY EMBODIMENTS OF THE INVENTION

Figure 1:
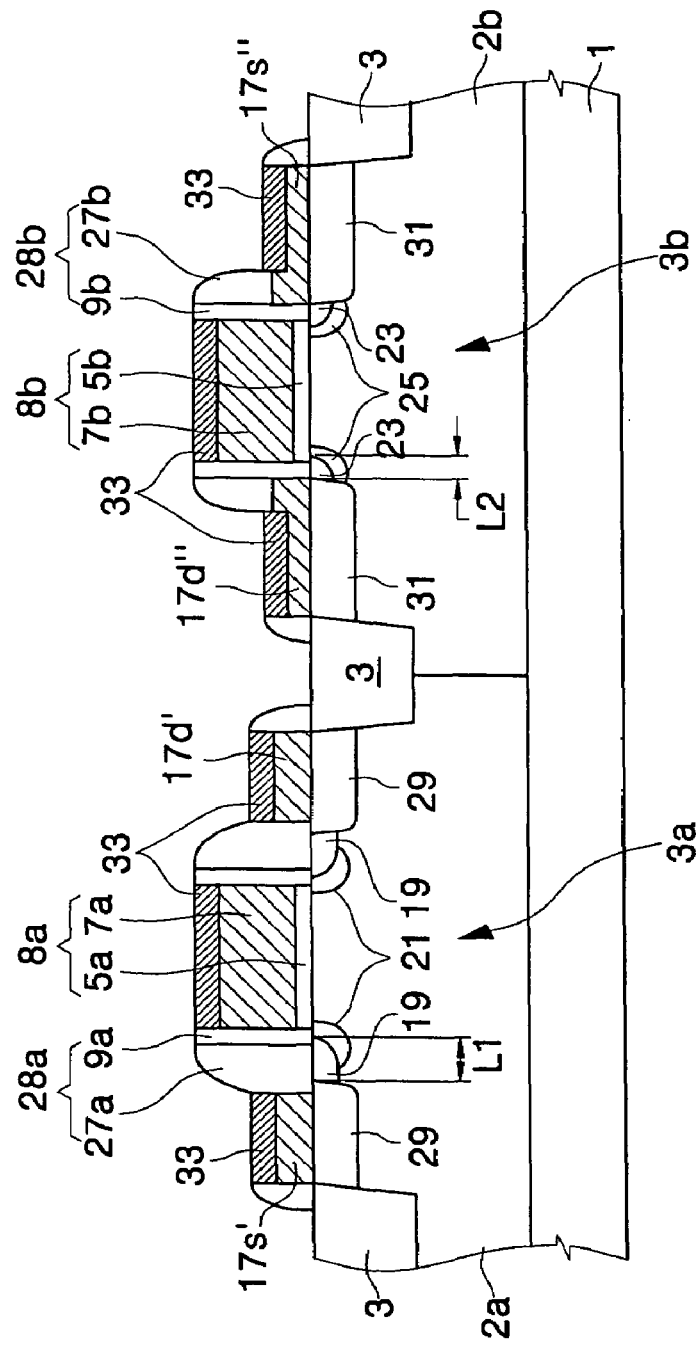
FIG. 1 is a cross sectional view illustrating CMOS semiconductor devices according to an exemplary embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein. In the drawings, the thicknesses of layers and regions are exaggerated for clarity. Like reference numerals in the specification denote like elements.

FIG. 1 is a cross sectional view illustrating CMOS semiconductor devices according to an exemplary embodiment of the present invention.

Referring to FIG. 1, an isolation layer 3 is provided in a predetermined region of a semiconductor substrate 1 to define first and second active regions 3a and 3b. The first active region 3a may be defined in a P-type well 2a, and the second active region 3b may be defined in an N-type well 2b. A first gate pattern 8a is provided to cross over the first active region 3a. Similarly, a second gate pattern 8b is provided to cross over the second active region 3b. The first gate pattern 8a may include a first gate insulating layer 5a and a first gate electrode 7a which are sequentially stacked, and the second gate pattern 8b may also include a second gate insulating layer 5b and a second gate electrode 7b which are sequentially stacked. The first and second gate electrodes 7a and 7b may be polycrystalline semiconductor patterns. For example, the first and second gate electrodes 7a and 7b may be polycrystalline silicon patterns.

A first elevated source region 17s' and a first elevated drain region 17d' are disposed at both sides of the first gate pattern 8a, respectively. The first elevated source/drain regions 17s' and 17d' are disposed on the first active region 3a. In more detail, the first elevated source/drain regions 17s' and 17d' may be in contact with the first active region 3a.

The first elevated source/drain regions 17s' and 17d' may be single crystalline epitaxial semiconductor patterns. For example, the first elevated source/drain regions 17s' and 17d' may be single crystalline epitaxial silicon patterns. In addition, the first elevated source/drain regions 17s' and 17d' may be epitaxial semiconductor patterns doped with first conductivity type impurities, for example, N-type impurities.

A first gate spacer 28a is interposed between the first gate pattern 8a and the first elevated source/drain regions 17s' and 17d'. The first gate spacer 28a may include a first inner gate spacer 9a covering a sidewall of the first gate pattern 8a and a first outer gate spacer 27a covering an outer sidewall of the first inner gate spacer 9a. That is, the first outer gate spacer 27a is interposed between the first inner gate spacer 9a and the first elevated source/drain regions 17s' and 17d'.

A second elevated source region 17s'' and a second elevated drain region 17d'' are disposed at both sides of the second gate pattern 8b, respectively. The second elevated source/drain regions 17s'' and 17d'' are disposed on the second active region 3b. In more detail, the second elevated source/drain regions 17s'' and 17d'' may be in contact with the second active region 3b.

The second elevated source/drain regions 17s'' and 17d'' may also be single crystalline epitaxial semiconductor patterns. For example, the second elevated source/drain regions 17s'' and 17d'' may be single crystalline epitaxial silicon patterns. In addition, the second elevated source/drain regions 17s'' and 17d'' may be epitaxial semiconductor patterns doped with second conductivity type impurities, for example, P-type impurities.

A second inner gate spacer 9b is interposed between the second gate pattern 8b and the second elevated source/drain regions 17s'' and 17d''. The second inner gate spacer 9b covers an entire sidewall of the second gate pattern 8b. Top surfaces of the second elevated source/drain regions 17s'' and 17d'' may be lower than top surfaces of the second gate pattern 8b, as shown in FIG. 1. In this case, a second outer gate spacer 27b is provided on an upper sidewall of the second inner gate spacer 9b. In addition, the second outer gate spacer 27b covers edges of the second elevated source/drain regions 17s'' and 17d'', which are adjacent to the second inner gate spacer 9b. The second inner gate spacer 9b and the second outer gate spacer 27b constitute a second gate spacer 28b.

As a result, the first elevated source/drain regions 17s' and 17d' are insulated from the first gate electrode 7a by the first inner gate spacer 9a and first outer gate spacer 27a, and the second elevated source/drain regions 17s" and 17d" are insulated from the second gate electrode 7b by the second inner gate spacer 9b. The first and second inner gate spacers 9a and 9b may be an insulating layer such as a silicon oxide layer or a silicon nitride layer. The first inner gate spacer 9a may have the same width as the second inner gate spacer 9b. The first and second outer gate spacers 27a, 27b may also be an insulating layer such as a silicon oxide layer or a silicon nitride layer. A first distance between the first elevated source/drain regions 17s' and 17d' and the first gate electrode 7a is greater than a second distance between the second elevated source/drain regions 17s" and 17d" and the second gate electrode 7b. Accordingly, a parasitic coupling capacitance between the first elevated source/drain regions 17s' and 17d' and the first gate electrode 7a may be less than a parasitic coupling capacitance between the second elevated source/drain regions 17s" and 17d" and the second gate electrode 7b.

First high-concentration source/drain regions 29 may be provided in the first active region 3a under the first elevated source/drain regions 17s' and 17d'. In addition, second high-concentration source/drain regions 31 may be provided in the second active region 3b under the second elevated source/drain regions 17s" and 17d". The first high-concentration source/drain regions 29 may have the same conductivity type as the first elevated source/drain regions 17s' and 17d', and the second high-concentration source/drain regions 31 may have the same conductivity type as the second elevated source/drain regions 17s" and 17d". For example, the first elevated source/drain regions 17s' and 17d' and the first high-concentration source/drain regions 29 may be doped with N-type impurities, and the second elevated source/drain regions 17s" and 17d" and the second high-concentration source/drain regions 31 may be doped with P-type impurities.

Moreover, first low-concentration source/drain regions 19 may be provided in the first active region 3a under the first gate spacer 28a, and second low-concentration source/drain regions 23 may be provided in the second active region 3b under the second inner gate spacer 9b. The first low-concentration source/drain regions 19 are in contact with the first high-concentration source/drain regions 29, and the second low-concentration source/drain regions 23 are in contact with the second high-concentration source/drain regions 31. As a result, a first length L1 of the first low-concentration source/drain regions 19 may be greater than a second length L2 of the second low-concentration source/drain regions 23.

The first low-concentration source/drain regions 19 may have the same conductivity type as the first high-concentration source/drain regions 29, and the second low-concentration source/drain regions 23 may have the same conductivity type as the second high-concentration source/drain regions 31. For example, the first low-concentration source/drain regions 23 may be N-type low-concentration source/drain regions, and the second low-concentration source/drain regions 23 may be P-type low-concentration source/drain regions. In this case, an NMOS transistor is provided at the first active region 3a, and a PMOS transistor is provided at the second active region 3b. In addition, the first low-concentration source/drain regions 19 have a lower impurity concentration than the first high-concentration source/drain regions 29, and the second low-concentration source/drain regions 23 have a lower impurity concentration than the second high-concentration source/drain regions 31.

As described above, in the event that the NMOS transistor and the PMOS transistor are provided at the first and second active regions 3a and 3b respectively, the electrical resistance of the N-type low-concentration source/drain regions 19 increases relative to the electrical resistance of the P-type low-concentration source/drain regions 23, and parasitic coupling capacitance of the second gate electrode 7b increases relative to the parasitic coupling capacitance of the first gate electrode 7a. Nevertheless, operating speeds of both the NMOS transistor and the PMOS transistor is improved because electron mobility is greater than hole mobility. In other words, the operating speeds of both the NMOS transistor and the PMOS transistors are improved because the operating speed of the NMOS transistor is subject to the coupling capacitance of the gate electrode rather than the source/drain resistance related to the electron mobility and the operating speed of the PMOS transistor is subject to the hole mobility rather than the gate coupling capacitance.

Subsequently, the first low-concentration source/drain regions 19 adjacent to a channel region under the first gate pattern 8a may be surrounded by first anti-punchthrough regions 21. Similarly, the second low-concentration source/drain regions 23 adjacent to a channel region under the second gate pattern 8b may be surrounded by second anti-punchthrough regions 25. The first anti-punchthrough regions 21 are impurity regions having the same conductivity type as the P-type well 2a, and the second anti-punchthrough regions 25 are impurity regions having the same conductivity type as the N-type well 2b.

In addition, a metal silicide layer 33 such as a nickel suicide layer or a cobalt silicide layer may be selectively provided on top surfaces of the gate electrodes 7a and 7b and top surfaces of the elevated source/drain regions 17s', 17d', 17s" and 17d". A bottom surface of the metal silicide layer 33 on the first elevated source/drain regions 17s' and 17d' may be higher than a bottom surface of the first gate spacer 28a. On the contrary, a bottom surface of the metal silicide layer 33 on the second elevated source/drain regions 17s" and 17d" may be lower than a bottom surface of the second outer gate spacer 27b covering edges of the second elevated source/drain regions 17s" and 17d".

Now, methods of fabricating the CMOS semiconductor devices according to exemplary embodiments of the present invention will be described with reference to FIGS. 2 to 7.

Figure 2:
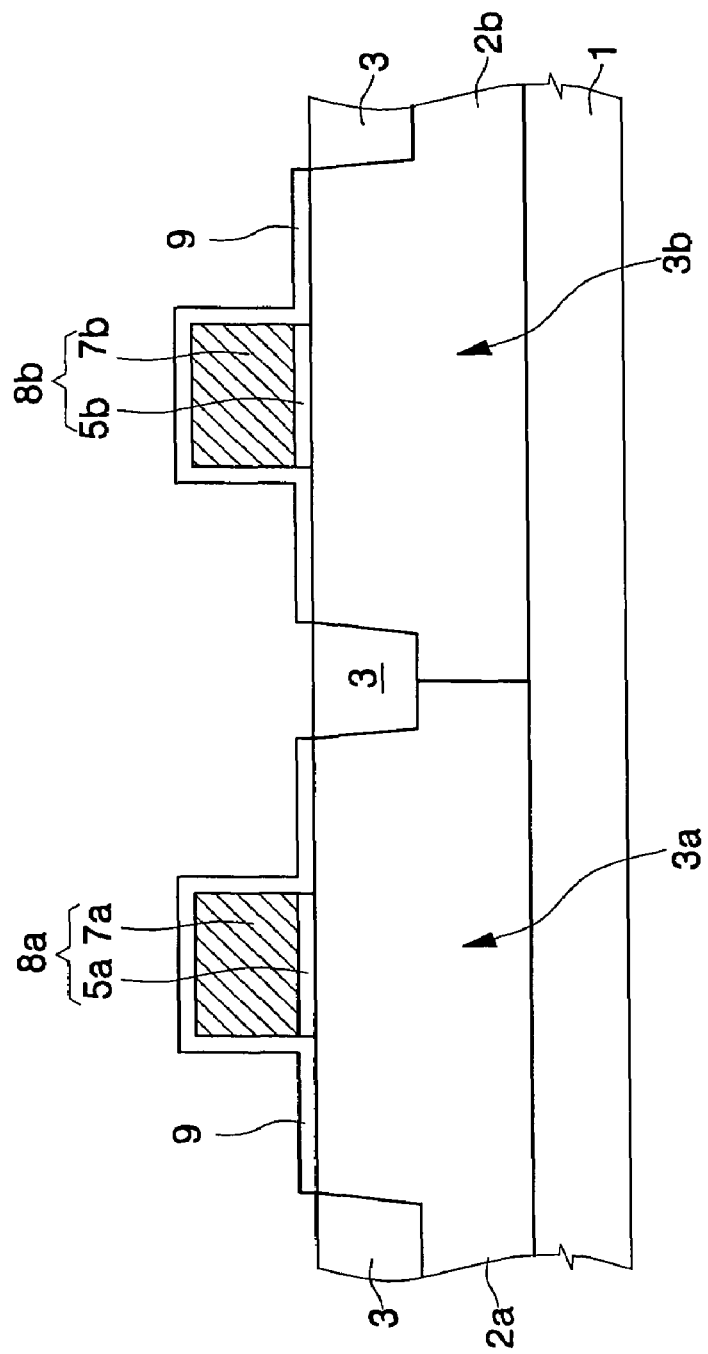
FIGS. 2 to 7 are cross sectional views to illustrate methods of fabricating CMOS semiconductor devices according to exemplary embodiments of the present invention.

Referring to FIG. 2, a P-type well 2a and an N-type well 2b are formed in first and second regions of a semiconductor substrate 1, respectively. The P-type well 2a and the n-type well 2b may be formed using a typical twin well formation method. An isolation layer 3 is formed in a predetermined region of the semiconductor substrate to define first and second active regions 3a and 3b in the P-type well 2a and the N-type well 2b respectively. The isolation layer 3 may be formed prior to formation of the P-type well 2a and the N-type well 2b.

A gate insulating layer is formed on the first and second active regions 3a and 3b, and a gate conductive layer is formed on the substrate having the gate insulating layer. The gate insulating layer may be formed of an insulating layer such as a thermal oxide layer, and the gate conductive layer may be formed of a polycrystalline semiconductor layer such as a polycrystalline silicon layer. The gate conductive layer is patterned to form first and second gate electrodes 7a and 7b that cross over the first and second active regions 3a and 3b respectively. The gate insulating layer may be over-etched to expose the first and second active regions 3a and 3b during formation of the first and second gate electrodes 7a and 7b. In this case, as shown in FIG. 2, a first gate insulating layer 5a may remain under the first gate electrode 7a, and a second gate insulating layer 5b may remain under the second gate electrode 7b. The first gate insulating layer 5a and the first gate electrode 7a constitute a first gate pattern 8a, and the second gate insulating layer 5b and the second gate electrode 7b constitute a second gate pattern 8b.

The substrate having the first and second gate patterns 8a and 8b is thermally oxidized to form a thermal oxide layer 9 on surfaces of the gate electrodes 7a and 7b and surfaces of the exposed active regions 3a and 3b. Alternatively, an insulating inner spacer layer may be formed using a chemical vapor deposition (CVD) technique instead of formation of the thermal oxide layer 9. In this case, the insulating inner spacer layer may be formed on an entire surface of the substrate having the gate patterns 8a and 8b. The insulating inner spacer layer may be formed of a CVD silicon oxide layer or a CVD silicon nitride layer.

Figure 3:
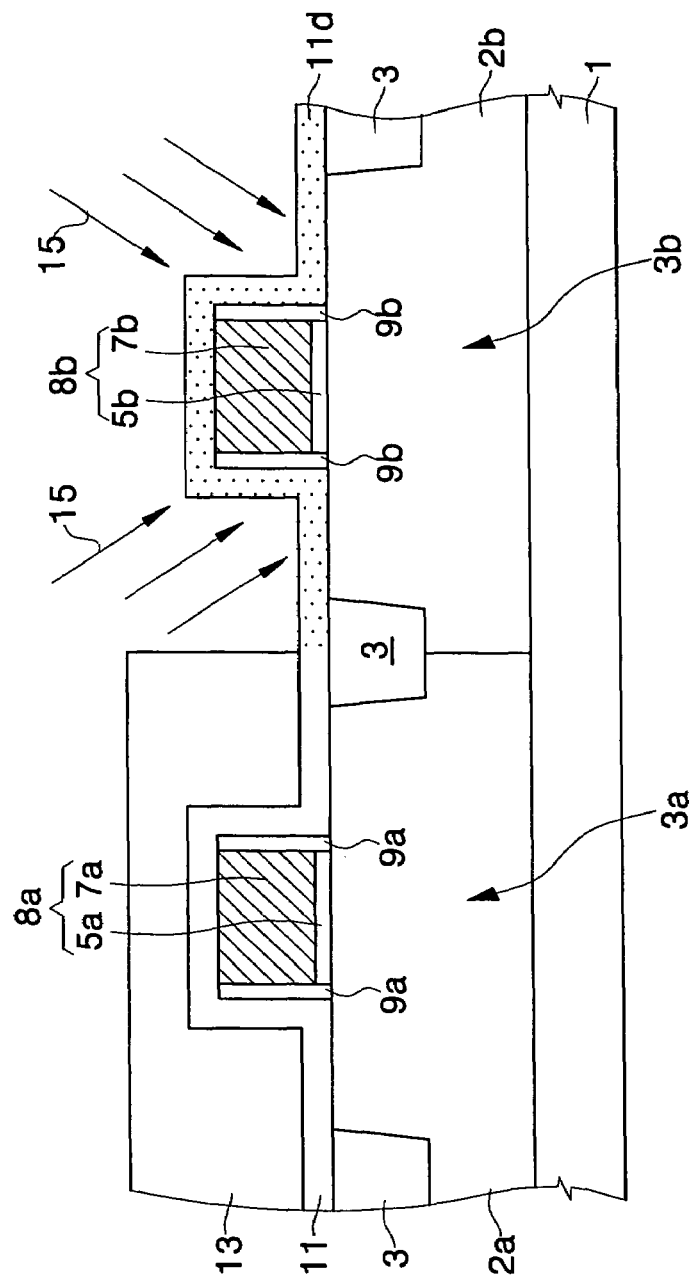

Referring to FIG. 3, the thermal oxide layer 9 or the insulating inner spacer layer is anisotropically etched to expose top surfaces of the gate electrodes 7a and 7b and top surfaces of the active regions 3a and 3b. As a result, a first inner gate spacer 9a and a second inner gate spacer 9b are formed on sidewalls of the first and second gate patterns 8a and 8b, respectively. A dummy spacer layer 11 is formed on the substrate having the first and second inner gate spacers 9a and 9b. The dummy spacer layer 11 may be formed of a material layer having an etching selectivity with respect to the first and second inner gate spacers 9a and 9b. For example, in the event that the inner gate spacers 9a and 9b are formed of a silicon oxide layer, the dummy spacer layer 11 may be formed of a silicon nitride layer. Alternatively, when the inner gate spacers 9a and 9b are formed of a silicon nitride layer, the dummy spacer layer 11 may be formed of a silicon oxide layer.

The dummy spacer layer 11 on the second active region 3b is selectively damaged to form a damaged dummy spacer layer 11d having a wet etching rate higher than the dummy spacer layer 11 on the first active region 3a.

The damaged dummy spacer layer 11d may be formed using an ion implantation technique. In more detail, a photoresist pattern 13 is formed on the dummy spacer layer 11. The photoresist pattern 13 is formed to cover the dummy spacer layer 11 on the first active region 3a and expose the dummy spacer layer 11 on the second active region 3b. Damage impurity ions 15 are implanted into the exposed dummy spacer layer 11 using the photoresist pattern 13 as an ion implantation mask, thereby forming the damaged dummy spacer layer 11d on the second active region 3b. The damage impurity ions 15 may be nitrogen ions, silicon ions, germanium ions or argon ions. In addition, as shown in FIG. 3, it is preferable that the damage impurity ions 15 are implanted at a tilted angle. This is for sufficiently implanting the damage impurity ions 15 into the dummy spacer layer 11 on a sidewall of the second gate pattern 8b. For example, an implantation angle of the damage impurity ions 15 may be less than 0° and greater than 90° with respect to a normal line perpendicular to a surface of the semiconductor substrate 1. In this case, the wet etching rate of the damaged dummy spacer layer 11d on the second active region 3b may be about five times higher than that of the initial dummy spacer layer 11 on the first active region 3a.

Figure 4:
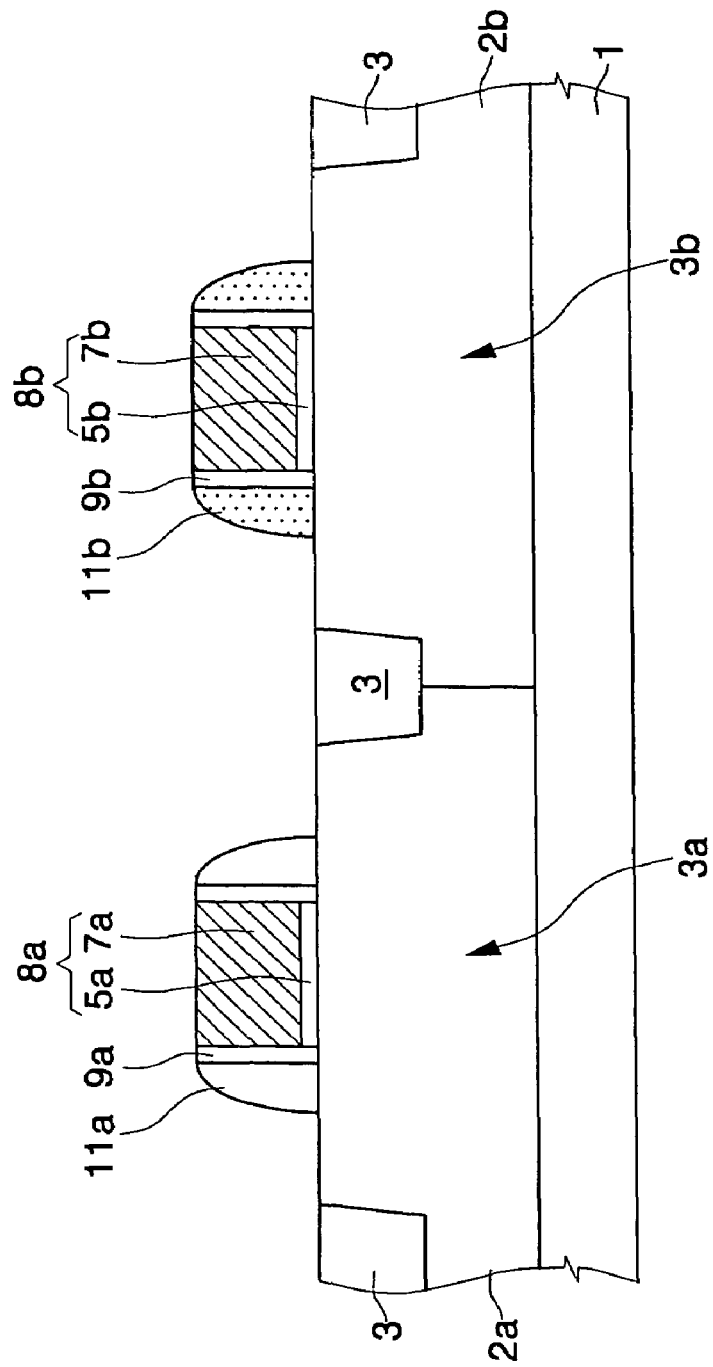

Referring to FIG. 4, the photoresist pattern 13 is removed, and the dummy spacer layer 11 including the damaged dummy spacer layer 11d is anisotropically etched to form first and second dummy gate spacers 11a and 11b on outer sidewalls of the first and second inner gate spacers 9a and 9b respectively. As a result, the first dummy gate spacer 11a is formed of the initial dummy spacer layer 11, and the second dummy gate spacer 11b is formed of the damaged dummy spacer layer 11d. Accordingly, the wet etching rate of the second dummy gate spacer 11b may be still higher than that of the first dummy gate spacer 11a.

Figure 5:
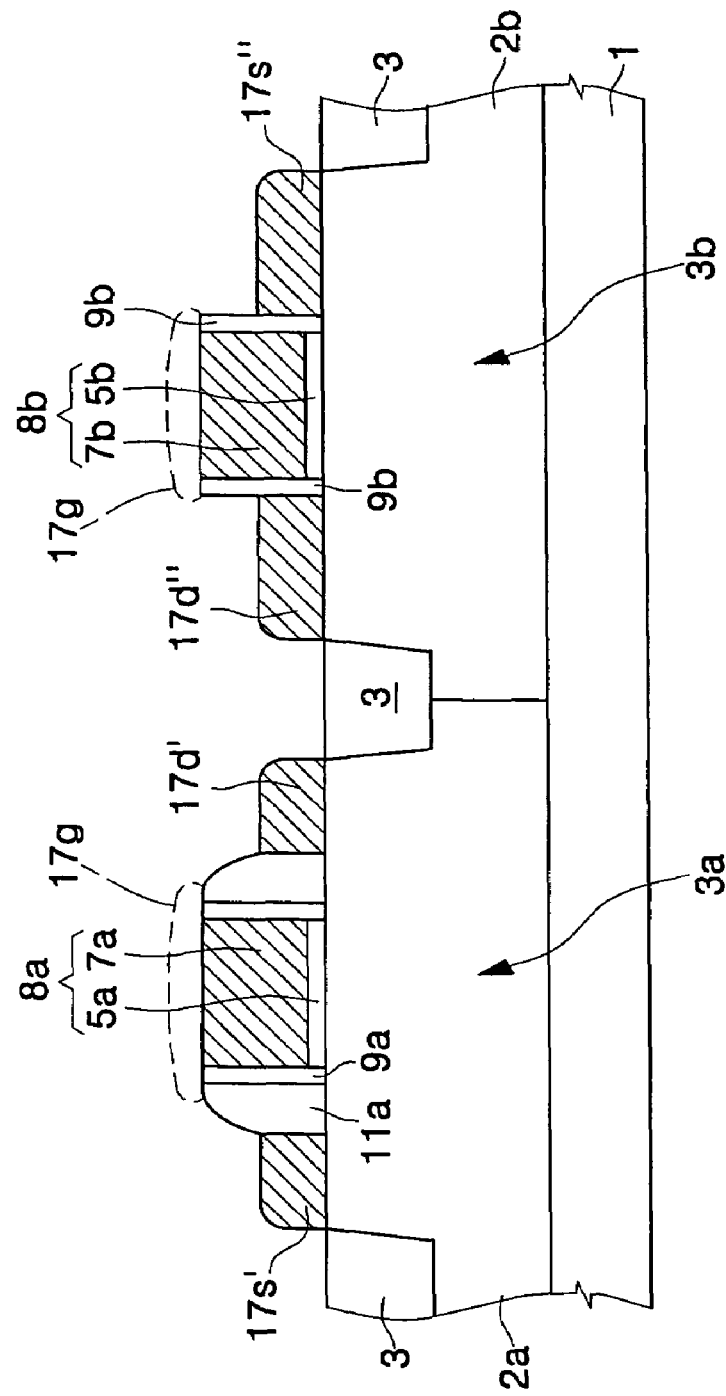

Referring to FIG. 5, the second dummy gate spacer 11b, e.g., the damaged dummy gate spacer, is selectively wet-etched to expose an outer sidewall of the second inner gate spacer 9b or to remain a portion of the second dummy gate spacer 11b. While the second dummy gate spacer 11b is wet-etched, it prevents the first dummy gate spacer 11a from being over-etched, because the wet etching rate of the first dummy gate spacer 11a is lower than that of the second dummy gate spacer 11b as described above.

When the dummy gate spacers 11a and 11b are formed of a silicon oxide layer, the second dummy gate spacer 11b may be wet-etched using hydrofluoric acid or buffered oxide etchant (BOE). Alternatively, when the dummy gate spacers 11a and 11b are formed of a silicon nitride layer, the second dummy gate spacer 11b may be wet-etched using phosphoric acid ($H_3PO_4$).

A surface of the substrate where the second dummy gate spacer 11b is wet-etched is cleaned to remove particles existing on the substrate and/or a native oxide layer existing on surfaces of the gate electrodes 7a and 7b and the active regions 3a and 3b. First elevated source/drain regions 17s' and 17d' and second elevated source/drain regions 17s" and 17d" are then formed on the first and second active regions 3a and 3b, respectively.

The first elevated source region 17s' and the first elevated drain region 17d' are formed at both sides of the first gate pattern 8a respectively, and the second elevated source region 17s" and the second elevated drain region 17d" are formed at both sides of the second gate pattern 8b respectively. As a result, the first inner gate spacer 9a and the first dummy gate spacer 11a are located between the first gate pattern 8a and the first elevated source/drain regions 17s' and 17d', and only the second inner gate spacer 9b is located between the second gate pattern 8b and the second elevated source/drain regions 17s" and 17d". Accordingly, a distance between the first gate pattern 8a and the first elevated source/drain regions 17s' and 17d' may be greater than a distance between the second gate pattern 8b and the second elevated source/drain regions 17s' and 17d".

The first and second elevated source/drain regions 17s', 17d', 17s" and 17d" may be formed of an epitaxial semiconductor layer, for example, an epitaxial silicon layer, an epitaxial germanium layer or an epitaxial silicon germanium layer using a selective epitaxial growth process. In this case, if the semiconductor substrate 1 is a single crystalline semiconductor substrate and the gate electrodes 7a and 7b are polycrystalline semiconductor patterns, the first and second elevated source/drain regions 17s', 17d', 17s", and 17d" are formed to have a single crystalline structure and gate epitaxial semiconductor patterns 17g having a polycrystalline structure may be formed on the gate electrodes 7a and 7b.

The gate epitaxial semiconductor patterns 17g may be grown in a lateral direction as well as in a vertical direction. In this case, the gate epitaxial semiconductor patterns 17g may be formed to have a greater width than the gate electrodes 7a and 7b. Therefore, T-shaped final gate electrodes may be formed over the first and second active regions 3a and 3b. In other words, edges of the gate epitaxial semiconductor pattern 17g on the first gate pattern 8a may cover the first dummy gate spacer 11a. In this case, the edges of the gate epitaxial semiconductor patterns 17g overlying the first dummy gate spacer 11a may disturb a subsequent ion implantation process for forming first low-concentration impurity regions to be described with reference to FIG. 6. Similarly, the first and second elevated source/drain regions 17s', 17d', 17s" and 17d" may also be grown in a lateral direction. In this case, if the width of the isolation layer 3 decreases, the adjacent elevated drain regions 17d' and 17d" can be electrically connected to each other. Therefore, it is preferable that the lateral growth of the first and second elevated source/drain regions 17s', 17d', 17s" and 17d" as well as the formation of the gate epitaxial semiconductor patterns 17g are suppressed during formation of the first and second elevated source/drain regions 17s', 17d', 17s' and 17d".

The first and second elevated source/drain regions 17s', 17d', 17s" and 17d" may be selectively formed only on the active regions 3a and 3b using a cyclic selective epitaxial growth technique. That is, the cyclic selective epitaxial growth technique may suppress the formation of the gate epitaxial semiconductor patterns 17g as well as the lateral growth of the first and second elevated source/drain regions 17s', 17d', 17s" and 17d".

The cyclic selective epitaxial growth process is achieved by supplying a main semiconductor source gas and a main etching gas on the substrate where the second dummy gate spacer 11b is wet-etched to selectively form a polycrystalline epitaxial semiconductor layer and a single crystalline epitaxial semiconductor layer on the gate electrodes and the active regions respectively. In addition, the cyclic selective epitaxial growth process further includes supplying a selective etching gas on the substrate having the epitaxial semiconductor layers to selectively remove the polycrystalline epitaxial semiconductor layer on the gate electrodes. The first step of supplying the main gases and the second step of supplying the selective etching gas may be alternately and repeatedly performed at least two times. Accordingly, only the elevated source/drain regions 17s', 17d', 17s" and 17d" having a desired thickness may be selectively formed on the active regions. The main etching gas suppresses the lateral growth of the epitaxial semiconductor layers onto the isolation layer 3 and the spacers 11a, 9a and 9b, and the selective etching gas selectively removes the polycrystalline epitaxial semiconductor layers 17g grown on the gate electrodes 7a and 7b.

A gas containing a halogen element which easily reacts with atoms (e.g., silicon atoms or germanium atoms) in the polycrystalline epitaxial semiconductor layers may be used as the main etching gas and the selective etching gas. For example, a hydrogen chloride (HCl) gas or a chlorine gas may be used as the main etching gas and the selective etching gas. In this case, the polycrystalline epitaxial semiconductor layer has an uneven surface e.g., a rough surface which is due to grain boundary regions, whereas the single crystalline epitaxial semiconductor layer has a flat surface. Therefore, the etch rate of the polycrystalline epitaxial semiconductor layer may be faster than that of the single crystalline epitaxial semiconductor layer when the selective etching gas is supplied. As a result, the polycrystalline epitaxial semiconductor layer can be selectively removed.

The first and second elevated source/drain regions 17s', 17d', 17s" and 17d" are preferably formed to have top surfaces which are lower than top surfaces of the gate electrodes 7a and 7b. In other words, it is preferable that the first and second elevated source/drain regions 17s', 17d', 17s" and 17d" are formed to have a thickness which is less than the thickness of the gate electrodes 7a and 7b, as shown in FIG. 5. Accordingly, an upper sidewall of the first dummy gate spacer 11a and an upper sidewall of the second inner gate spacer 9b can be exposed even after formation of the elevated source/drain regions 17s', 17d', 17s" and 17d".

Figure 6:
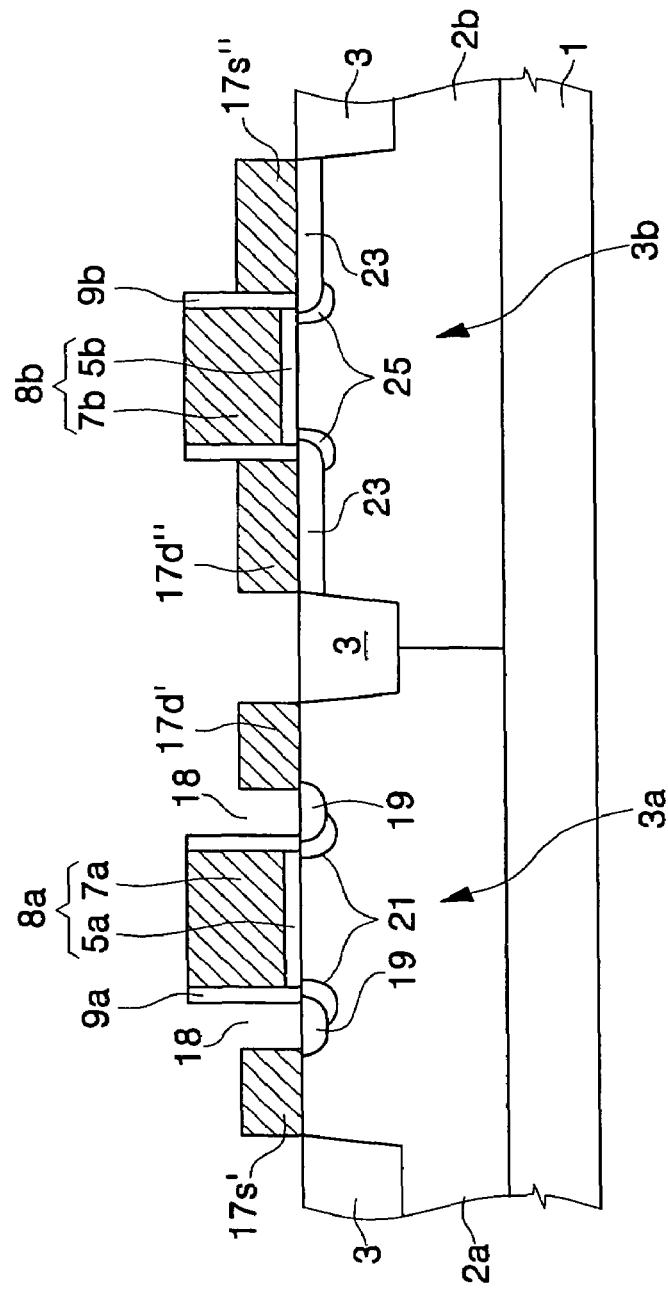

Referring to FIG. 6, the first dummy gate spacer 11a is selectively removed to form an opening 18 surrounding the first inner gate spacer 9a. In the event that the first and second inner gate spacers 9a and 9b are formed with a silicon oxide layer and the first dummy gate spacer 11a is formed of a silicon nitride layer, the first dummy gate spacer 11a may be selectively removed using phosphoric acid ($H_3PO_4$). Alternatively, in the event that the first and second inner gate spacers 9a and 9b are formed of a silicon nitride layer and the first dummy gate spacer 11a is formed of a silicon oxide layer, the first dummy gate spacer 11a may be selectively removed using hydrofluoric acid (HF) or buffered oxide etchant (BOE).

Subsequently, using the first gate pattern 8a, the first inner gate spacer 9a and the first elevated source/drain regions 17s' and 17d' as ion implantation masks, N-type impurity ions are implanted into the first active region 3a to form first low-concentration source/drain regions 19 in the first active region 3a under the opening 18. In addition, using the first gate pattern 8a, the first inner gate spacer 9a and the first elevated source/drain regions 17s' and 17d' as ion implantation masks, P-type impurity ions are implanted into the first active region 3a to form first anti-punchthrough regions 21 surrounding the first low-concentration source/drain regions 19 adjacent to a channel region under the first gate pattern 8a. The first anti-punchthrough regions 21 may be formed using a typical halo ion implantation technique.

Moreover, using the second gate pattern 8b and the second inner gate spacer 9b as ion implantation masks, P-type impurity ions are implanted into the second active region 3b to form second low-concentration source/drain regions 23 in the second active region 3b under the second elevated source/drain regions 17s" and 17d". In addition, using the second gate pattern 8b and the second inner gate spacer 9b as ion implantation masks, N-type impurity ions are implanted into the second active region 3b to form second anti-punchthrough regions 25 surrounding the second low-concentration source/drain regions 23 adjacent to a channel region under the second gate pattern 8b. The second anti-punchthrough regions 25 may also be formed using a typical halo ion implantation technique. The anti-punchthrough regions 21 and 25 may be formed prior to formation of the low-concentration source/drain regions 19 and 23. In any case, the low-concentration source/drain regions 19 and 23 and the anti-punchthrough regions 21 and 25 are formed after the selective epitaxial growth process performed at a high temperature of about 800° C. Therefore, according to the exemplary embodiments of the present invention, the excessive diffusion of the impurity regions 19, 21, 23 and 25, in particular, the low-concentration source/drain regions 19 and 23 is prevented to significantly suppress a short channel effect of MOS transistors.

Figure 7:
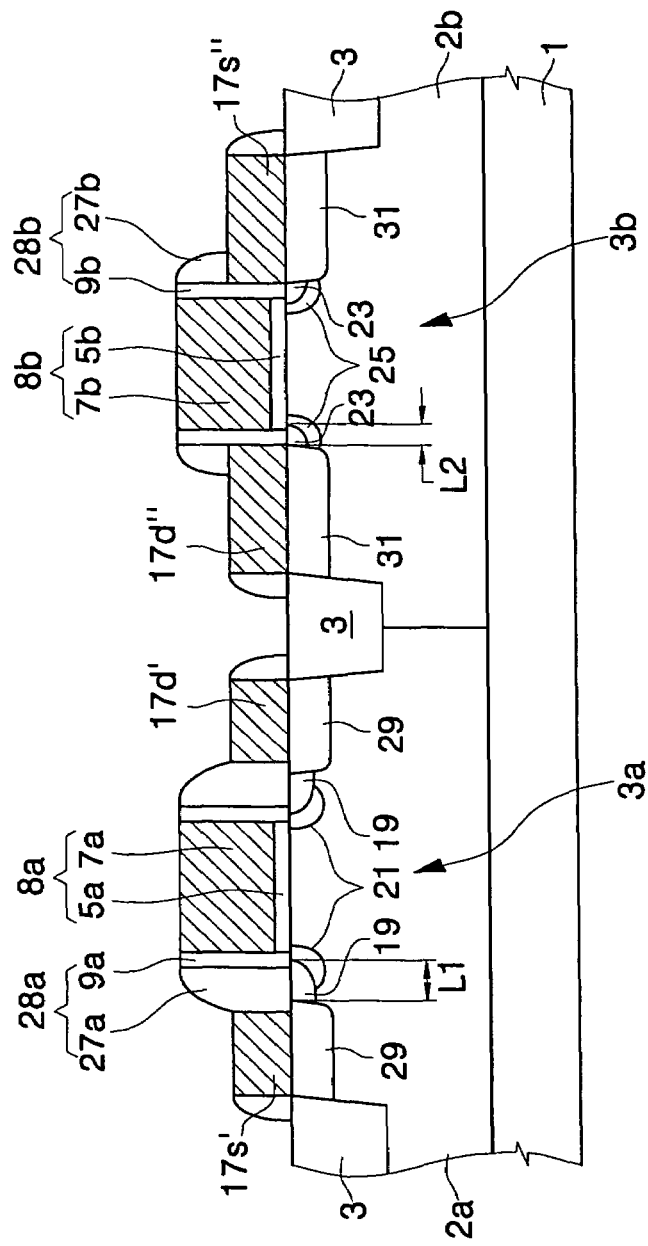

Referring to FIG. 7, an insulating outer spacer layer is formed on the substrate having the low-concentration source/drain regions 19 and 23 and the anti-punchthrough regions 21 and 25. The insulating outer spacer layer is formed to fill the opening 18. In addition, the insulating outer spacer layer may be formed of an insulating layer such as a silicon nitride layer or a silicon oxide layer. The insulating outer spacer layer is anisotropically etched to expose top surfaces of the gate electrodes 7a and 7b and top surfaces of the elevated source/drain regions 17s', 17d', 17s" and 17d". As a result, a first outer gate spacer 27a covering a sidewall of the first inner gate spacer 9a and filling the opening 18 is formed, and a second outer gate spacer 27b covering an upper sidewall of the second inner gate spacer 9b are formed. The second outer gate spacer 27b is also formed to cover edges of the second elevated source/drain regions 17s" and 17d". The first inner gate spacer 9a and the first outer gate spacer 27a constitute a first gate spacer 28a, and the second inner gate spacer 9b and the second outer gate spacer 27b constitute a second gate spacer 28b.

Subsequently, using the first gate pattern 8a and the first gate spacer 28a as ion implantation masks, N-type impurity ions are implanted into the first active region 3a to form first high-concentration source/drain regions 29 under the first elevated source/drain regions 17s' and 17d'. Accordingly, an NMOS transistor is formed at the first active region 3a. The first high-concentration source/drain regions 29 are formed to have an impurity concentration higher than the first low-concentration source/drain regions 19. During formation of the first high-concentration source/drain regions 29, the first elevated source/drain regions 17s' and 17d' may be doped with the N-type impurity ions. As a result, the first low-concentration source/drain regions 19 may remain under the first gate spacer 28a and have a first length L1 corresponding to the width of the first gate spacer 28a.

Using the second gate pattern 8b and the second gate spacer 28b as ion implantation masks, P-type impurity ions are implanted into the second active region 3b to form second high-concentration source/drain regions 31 under the second elevated source/drain regions 17s" and 17d". Accordingly, a PMOS transistor is formed at the second active region 3b. The second high-concentration source/drain regions 31 are formed to have an impurity concentration higher than the second low-concentration source/drain regions 23. During formation of the second high-concentration source/drain regions 31, the second elevated source/drain regions 17s" and 17d" may be doped with the P-type impurity ions. In this case, the second high-concentration source/drain regions 31 can be easily diffused up to the boundary regions of the second elevated source/drain regions 17s" and 17d" and the second inner gate spacer 9b during a subsequent thermal treatment process. As a result, the second low-concentration source/drain regions 23 may remain under the second inner gate spacer 9b and have a second length L2 which is less than the first length L1.

As described above, coupling capacitance between the second gate electrode 7b and the second source/drain regions 31, 17d" and 17s" of the PMOS transistor is greater than coupling capacitance between the first gate electrode 7a and the first source/drain regions 29, 17s' and 17d' of the NMOS transistor. Nevertheless, according to the exemplary embodiments of the present invention described above, the operating speed of the PMOS transistor is improved. This is because electrical resistance of the second low-concentration source/drain regions 23 of the PMOS transistor is less than electrical resistance of the first low-concentration source/drain regions 19 of the NMOS transistor. That is, the operating speed of the PMOS transistor is subject to the electrical resistance of the source/drain regions rather than the coupling capacitance of the gate electrode.

Moreover, the operating speed of the NMOS transistor is subject to the coupling capacitance of the gate electrode rather than the electrical resistance of the source/drain regions. This is because the electron mobility is about five times greater than the hole mobility. That is, when the width of the first gate spacer 28a increases, the electrical resistance of the first low-concentration source/drain regions 19, e.g., N-type low-concentration source/drain regions also increases whereas the coupling capacitance of the first gate electrode 7a decreases. Accordingly, the operating speed of the NMOS transistor is improved even though the width of the first gate spacer 28a increases.

A typical salicide (self-aligned silicide) process may be applied to the substrate having the high-concentration source/drain regions 29 and 31, thereby forming a metal silicide layer (33 in FIG. 1) on the elevated source/drain regions 17s', 17d', 17s" and 17d" and the gate electrodes 7a and 7b.

According to the exemplary embodiments of the present invention as described above, gate coupling capacitance of an NMOS transistor is relatively reduced as compared to gate coupling capacitance of a PMOS transistor. Additionally, electrical resistance of low-concentration source/drain regions of the PMOS transistor is relatively reduced as compared to electrical resistance of low-concentration source/drain regions of the NMOS transistor. Thus, the operating characteristics of both the NMOS transistor and the PMOS transistor are optimized due to the exemplary embodiments of the present invention. In addition, with the above-mentioned exemplary embodiments of the present invention, the elevated source/drain regions are formed using a selective epitaxial growth process performed at a high temperature of about 800° C., and the low-concentration source/drain regions of the NMOS transistor and the PMOS transistor are formed after the selective epitaxial growth process. Therefore, excessive diffusion of the low-concentration source/drain regions is prevented to significantly suppress a short channel effect of the MOS transistors.

What is claimed is:

1. A Complementary Metal Oxide Semiconductor (CMOS) device, comprising:
an isolation layer provided in a semiconductor substrate to define first and second active regions;
a first gate pattern crossing over the first active region;
a first elevated source region and a first elevated drain region disposed at both sides of the first gate pattern and provided on the first active region;
a first gate spacer interposed between the first gate pattern and the first elevated source/drain region;
a second gate pattern crossing over the second active region;
a second elevated source region and a second elevated drain region disposed at both sides of the second gate pattern and provided on the second active region;
a second gate spacer covering edges of the second elevated source/drain regions adjacent to the second gate pattern and an upper sidewall of the second gate pattern and wherein a distance between the first gate pattern and a sidewall of the first elevated source/drain regions facing the first gate pattern is greater than a distance between the second gate pattern and a sidewall of the second elevated source/drain regions facing the second gate pattern, wherein the second gate spacer comprises:
a second inner gate spacer interposed between the second gate pattern and the second elevated source/drain regions, the second inner gate spacer covering a sidewall of the second gate pattern; and
a second outer gate spacer covering edges of the second elevated source/drain regions adjacent to the second inner gate spacer and an upper sidewall of the second inner gate spacer, and wherein edges of the second elevated source/drain regions have first top surfaces which are parallel to a top surface of semiconductor substrate, and wherein the first top surfaces of the edges of the second elevated source/drain regions are in direct physical contact with the second outer gate spacer of the second gate spacer;
first high-concentration source/drain regions formed in the first active region under the first elevated source/drain regions;
first low-concentration source/drain regions provided in the first active region under the first gate spacer, the first low-concentration source/drain regions contacting the first high-concentration source/drain regions;

second high-concentration source/drain regions formed in the second active region under the second elevated source/drain regions; and second low-concentration source/drain regions provided in the second active region under a region between the second gate pattern and the second elevated source/drain regions, the second low-concentration source/drain regions contacting the second high-concentration source/drain regions.

2. The CMOS device according to claim 1, wherein the first elevated source/drain regions are N-type elevated source/drain regions, and the second elevated source/drain regions are P-type elevated source/drain regions.

3. The CMOS device according to claim 1, wherein the first and second elevated source/drain regions are epitaxial semiconductor patterns.

4. The CMOS device according to claim 1, wherein the first gate spacer comprises:
a first inner gate spacer covering a sidewall of the first gate pattern; and
a first outer gate spacer interposed between the first inner gate spacer and the first elevated source/drain regions.

5. The CMOS device according to claim 4, wherein the first and second inner gate spacers are a silicon oxide layer or a silicon nitride layer.

6. The CMOS device according to claim 4, wherein the first and second outer gate spacers are a silicon oxide layer or a silicon nitride layer.

7. The CMOS device according to claim 1, wherein each of the first and second gate patterns comprise a gate insulating layer and a gate electrode which are sequentially stacked.

8. The CMOS device according to claim 7, wherein the gate electrodes are polycrystalline semiconductor patterns, and the first and second elevated source/drain regions are single crystalline epitaxial semiconductor patterns.

9. The CMOS device according to claim 8, further comprising a metal silicide layer formed on top surfaces of the gate electrodes and top surfaces of the elevated source/drain regions.

10. The CMOS device according to claim 9, wherein a bottom surface of the metal suicide layer on the first elevated source/drain regions is higher than a bottom surface of the first gate spacer, and a bottom surface of the metal silicide layer on the second elevated source/drain regions is lower than a bottom surface of a second gate spacer on edges of the second elevated source/drain regions.

11. The CMOS device according to claim 1, wherein the first high-concentration source/drain regions and the first low-concentration source/drain regions have the same conductivity type as the first elevated source/drain regions, and the second high-concentration source/drain regions and the second low-concentration source/drain regions have the same conductivity type as the second elevated source/drain regions.

12. The CMOS device according to claim 11, further comprising:
a first anti-punchthrough region disposed adjacently to a channel region under the first gate pattern and surrounding the first low-concentration source/drain regions; and
a second anti-punchthrough region disposed adjacently to a channel region under the second gate pattern and surrounding the second low-concentration source/drain regions.

13. The CMOS device according to claim 1, wherein a length of the first low-concentration source/drain regions is greater than a length of the second low-concentration source/drain regions.

14. A Complementary Metal Oxide Semiconductor (CMOS) device, comprising:
an isolation layer provided in a semiconductor substrate to define first and second active regions;
a first gate pattern crossing over the first active region;
a first elevated source region and a first elevated drain region disposed at both sides of the first gate pattern and provided on the first active region;
a first gate spacer interposed between the first gate pattern and the first elevated source/drain region;
a second gate pattern crossing over the second active region;
a second elevated source region and a second elevated drain region disposed at both sides of the second gate pattern and provided on the second active region; and
a second gate spacer covering edges of the second elevated source/drain regions adjacent to the second gate pattern and an upper sidewall of the second gate pattern, and wherein a first width of the first gate spacer interposed between the first gate pattern and the first elevated source/drain region is greater than a second width of the second gate spacer covering the edges of the second elevated source/drain regions adjacent to the second gate pattern and the upper sidewall of the second gate pattern and wherein the first width and the second width are on a same horizontal plane, and wherein the second gate spacer comprises:
a second inner gate spacer interposed between the second gate pattern and the second elevated source/drain regions, the second inner gate spacer covering a sidewall of the second gate pattern; and
a second outer gate spacer covering edges of the second elevated source/drain regions adjacent to the second inner gate spacer and an upper sidewall of the second inner gate spacer, and wherein edges of the second elevated source/drain regions have first top surfaces which are parallel to a top surface of the semiconductor substrate, and top surfaces of the edges of the second elevated source/drain regions are in direct physical contact with the second outer gate spacer of the second gate spacer.

15. The CMOS device according to claim 14, further comprising:
first high-concentration source/drain regions formed in the first active region under the first elevated source/drain regions;
first low-concentration source/drain regions provided in the first active region under the first gate spacer, the first low-concentration source/drain regions contacting the first high-concentration source/drain regions;
second high-concentration source/drain regions formed in the second active region under the second elevated source/drain regions; and
second low-concentration source/drain regions provided in the second active region under a region between the second gate pattern and the second elevated source/drain regions, the second low-concentration source/drain regions contacting the second high-concentration source/drain regions;
wherein the first high-concentration source/drain regions and the first low-concentration source/drain regions have the same conductivity type as the first elevated source/drain regions, and the second high-concentration source/drain regions and the second low-concentration source/drain regions have the same conductivity type as the second elevated source/drain regions.

16. The CMOS device according to claim 15, further comprising:
   a first anti-punchthrough region disposed adjacently to a channel region under the first gate pattern and surrounding the first low-concentration source/drain regions; and
   a second anti-punchthrough region disposed adjacently to a channel region under the second gate pattern and surrounding the second low-concentration source/drain regions.

17. The CMOS device according to claim 15, wherein a length of the first low-concentration source/drain regions is greater than a length of the second low-concentration source/drain regions.

18. The CMOS device according to claim 14, wherein top surfaces of the first elevated source/drain regions are lower than top surfaces of the first gate pattern, and wherein top surfaces of the second elevated source/drain regions are lower than top surfaces of the second gate pattern.

19. The CMOS device according to claim 14, wherein the first gate spacer comprises:
   a first inner gate spacer covering a sidewall of the first gate pattern; and
   a first outer gate spacer interposed between the first inner gate spacer and the first elevated source/drain regions.

20. A Complementary Metal Oxide Semiconductor (CMOS) device, comprising:
   an isolation layer provided in a semiconductor substrate to define first and second active regions;
   a first gate pattern crossing over the first active region;
   a first elevated source region and a first elevated drain region disposed at both sides of the first gate pattern and provided on the first active region;
   a first gate spacer interposed between the first gate pattern and the first elevated source/drain region;
   a second gate pattern crossing over the second active region;
   a second elevated source region and a second elevated drain region disposed at both sides of the second gate pattern and provided on the second active region; and
   a second gate spacer covering edges of the second elevated source/drain regions adjacent to the second gate pattern and an upper sidewall of the second gate pattern, and wherein edges of the second elevated source/drain regions have first top surfaces which are parallel to a top surface of the semiconductor substrate, and wherein the first top surfaces of the edges of the second elevated source/drain regions are in direct physical contact with a portion of the second gate spacer.

21. The CMOS device according to claim 14, further comprising a metal silicide layer formed on top surfaces of the first gate pattern, the second gate pattern, and the first elevated source/drain regions and the second elevated source/drain regions.

22. The CMOS device according to claim 20, wherein the second gate spacer comprises:
   a second inner gate spacer interposed between the second gate pattern and the second elevated source/drain regions, the second inner gate spacer covering a sidewall of the second gate pattern; and
   a second outer gate spacer covering edges of the second elevated source/drain regions adjacent to the second inner gate spacer and an upper sidewall of the second inner gate spacer, and wherein edges of the second elevated source/drain regions have first top surfaces which are parallel to a top surface of the semiconductor substrate, and wherein the first top surfaces of the edges of the second elevated source/drain regions are in direct physical contact with the second outer gate spacer of the second gate spacer.

23. The CMOS device according to claim 22, wherein a minimum distance between the first gate pattern and the first elevated source/drain regions is greater than a minimum distance between the second gate pattern and the second elevated source/drain regions.

* * * * *